United States Patent
Tseng et al.

(10) Patent No.: US 9,589,970 B1
(45) Date of Patent: Mar. 7, 2017

(54) ANTIFUSE ONE-TIME PROGRAMMABLE MEMORY

(71) Applicant: UNITED MICROELECTRONICS CORP., Hsin-Chu (TW)

(72) Inventors: Yuan-Heng Tseng, Pingtung County (TW); Chih-Shan Wu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/225,842

(22) Filed: Aug. 2, 2016

(51) Int. Cl.
| | | |
|---|---|---|
| H01L 27/112 | (2006.01) | |
| H01L 29/423 | (2006.01) | |
| H01L 29/778 | (2006.01) | |
| H01L 29/78 | (2006.01) | |
| H01L 29/08 | (2006.01) | |
| H01L 29/161 | (2006.01) | |
| H01L 29/165 | (2006.01) | |
| H01L 29/24 | (2006.01) | |
| H01L 29/267 | (2006.01) | |
| H01L 27/092 | (2006.01) | |
| H01L 29/06 | (2006.01) | |
| H01L 23/525 | (2006.01) | |

(52) U.S. Cl.
CPC .... *H01L 27/11206* (2013.01); *H01L 23/5252* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/24* (2013.01); *H01L 29/267* (2013.01); *H01L 29/7848* (2013.01)

(58) Field of Classification Search
CPC ........... H01L 27/11206; H01L 27/0924; H01L 29/0653; H01L 29/0847; H01L 29/7883; H01L 23/5253
USPC .... 257/50, 190, 316, 401, E27.103, E21.69; 438/257; 365/96, 148, 185.28, 185.33
See application file for complete search history.

(56) References Cited

U.S. PATENT DOCUMENTS

| | | | | |
|---|---|---|---|---|
| 9,117,749 | B1* | 8/2015 | Or-Bach | ............. H01L 27/2436 |
| 2012/0068241 | A1* | 3/2012 | Sakuma | ............ H01L 27/11519 |
| | | | | 257/314 |
| 2012/0139030 | A1* | 6/2012 | Sakuma | ............ H01L 21/28273 |
| | | | | 257/326 |
| 2012/0195091 | A1 | 8/2012 | Schmitt | |
| 2013/0148409 | A1* | 6/2013 | Chung | ................ H01L 27/1211 |
| | | | | 365/148 |
| 2014/0098591 | A1 | 4/2014 | Chen | |

(Continued)

*Primary Examiner* — Dao H Nguyen
(74) *Attorney, Agent, or Firm* — Winston Hsu; Scott Margo

(57) ABSTRACT

An antifuse one-time programmable (OTP) memory cell includes a semiconductor substrate, an isolation region, and a fin structure protruding from a top surface of the isolation region. The fin structure has an end portion with a sidewall surface above the top surface. A select gate transistor is disposed on the fin structure. The select gate transistor has a select gate traversing the fin structure, a select gate dielectric layer, a drain region, and a source region. A vertical program gate transistor is serially connected to the select gate transistor through the source region. The vertical program gate transistor has a program gate directly disposed on the isolation region and covering the sidewall surface of the end portion, and a program gate dielectric layer between the program gate and the sidewall surface.

20 Claims, 5 Drawing Sheets

(56) References Cited

U.S. PATENT DOCUMENTS

| | | | |
|---|---|---|---|
| 2014/0346603 A1* | 11/2014 | Toh | H01L 27/11206 257/350 |
| 2015/0035039 A1* | 2/2015 | Li | H01L 21/845 257/316 |
| 2016/0141295 A1* | 5/2016 | Wu | H01L 27/11206 365/96 |
| 2016/0300622 A1* | 10/2016 | Hsu | G11C 17/16 |
| 2016/0308062 A1* | 10/2016 | Li | H01L 21/845 |

* cited by examiner

| | | WL | SL | BL |
|---|---|---|---|---|
| PGM | select | Vcc | HV | 0 |
| | un-select | 0 | 0 | F |
| Read | select | Vcc | 0 | Vcc |
| | un-select | 0 | 0 | 0 |

US 9,589,970 B1

ANTIFUSE ONE-TIME PROGRAMMABLE MEMORY

BACKGROUND OF THE INVENTION

1. Field of the Invention

The invention relates generally to a non-volatile programmable memory device and, more particularly, to an antifuse one-time programmable (OTP) memory cell with a vertical-channel program gate transistor.

2. Description of the Prior Art

An anti-fuse is a structure alterable to a conductive state, or in other words, an electronic device that changes state from not conducting to conducting. Equivalently, the binary states can be either one of high resistance and low resistance in response to electric stress, such as a programming voltage or current.

As known in the art, one time programmable (OTP) cells can be programmed only once. The OTP cells do not lose the stored information when the memory device is no longer supplied with power, nor can the information be erased to enable re-programming. The information can be erased by writing all cells.

FinFET technology is known in the art. The FinFET technology shows promise in offering higher areal gate density than more conventional planar CMOS devices, as well as better device performance, and lower power consumption.

It is desirable to incorporate the manufacture of antifuses into existing 14 nm FinFET processes for creating the high-density, embedded antifuse OTP cell structures.

SUMMARY OF THE INVENTION

It is one object of the present invention to provide a highly scalable antifuse one-time programmable (OTP) memory cell.

It is another object of the present invention to provide a high-density, embedded antifuse one-time programmable (OTP) memory device that is fully compatible with 14 nm (or beyond) FinFET technology.

To these ends, according to one aspect of the present invention, there is provided an antifuse one-time programmable (OTP) memory cell including a semiconductor substrate, an isolation region in the semiconductor substrate, and at least a fin structure protruding from a top surface of the isolation region. The fin structure has an end portion with a sidewall surface above the top surface. A select gate transistor is disposed on the fin structure. The select gate transistor comprises a select gate traversing the fin structure, a select gate dielectric layer between the select gate and the fin structure, a drain region in the fin structure on one side of the select gate, and a source region in the fin structure on the other side of the select gate. A vertical program gate transistor is serially connected to the select gate transistor through the source region. The vertical program gate transistor comprises a program gate directly disposed on the isolation region and covering the sidewall surface of the end portion, and a program gate dielectric layer between the program gate and the sidewall surface.

According to one aspect of the present invention, there is provided an antifuse one-time programmable (OTP) memory device including a semiconductor substrate, a first fin structure having a first end portion with a first sidewall surface, a second fin structure having a second end portion with a second sidewall surface directly facing the first sidewall surface, and an isolation region in the semiconductor substrate. The isolation region has a top surface extending between the first sidewall surface and the second sidewall surface. A first select gate transistor is provided on the first fin structure. The first select gate transistor comprises a first select gate traversing the first fin structure, a first drain region in the first fin structure on one side of the first select gate, and a first source region in the first fin structure on the other side of the first select gate. A second select gate transistor is provided on the second fin structure. The second select gate transistor comprises a second select gate traversing the second fin structure, a second drain region in the second fin structure on one side of the second select gate, and a second source region in the second fin structure on the other side of the second select gate. A vertical program gate transistor is serially connected to the first select gate transistor through the first source region and is serially connected to the second select gate transistor through the second source region. The vertical program gate transistor comprises a program gate directly disposed on the top surface of the isolation region and covering the first sidewall surface and the second sidewall surface.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The term "horizontal" as used herein is defined as a plane parallel to the conventional major plane or surface of the semiconductor chip or die substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Figure 1:
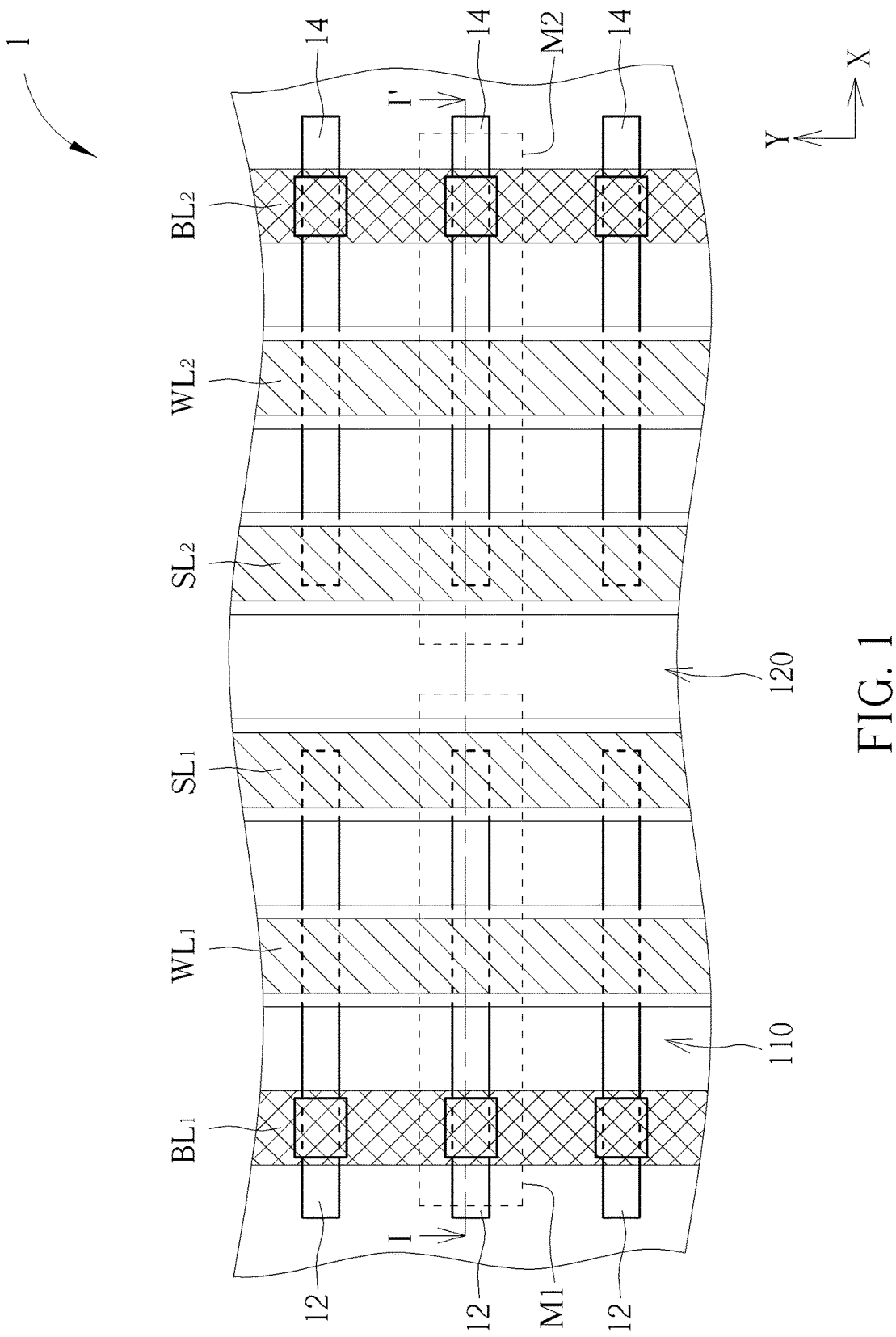
FIG. 1 is a schematic layout diagram showing a portion of an antifuse one-time programmable (OTP) memory device according to one embodiment of the invention.
Figure 2:
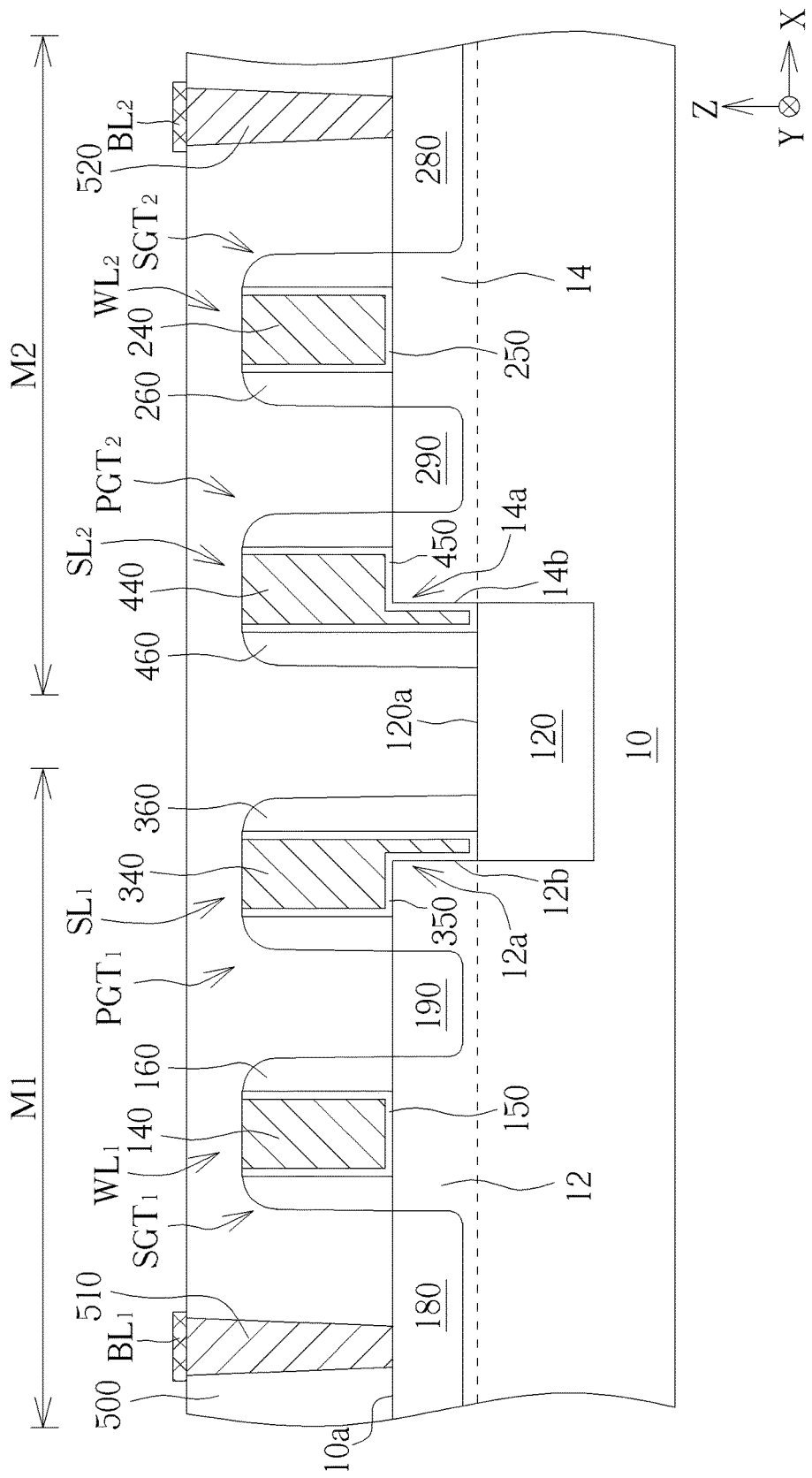
FIG. 2 is a schematic, cross-sectional view showing two antifuse OTP memory cells taken along line I-I' in FIG. 1.

Please refer to FIG. 1 and FIG. 2. FIG. 1 is a schematic layout diagram showing a portion of an antifuse one-time programmable (OTP) memory device according to one embodiment of the invention. FIG. 2 is a schematic, cross-sectional view showing two antifuse OTP memory cells of the antifuse OTP memory device taken along line I-I' in FIG.

As shown in FIG. 1 and FIG. 2, an antifuse OTP memory device 1 comprises an array of antifuse OTP memory cells including cell $M_1$ and cell $M_2$, which are fabricated on a semiconductor substrate 10. For example, the semiconductor substrate 10 may be a silicon substrate, a silicon-on-insulator (SOI) substrate, or the like.

A plurality of fin structures 12 and 14 formed integrally with the bulk portion of the semiconductor substrate 10 is provided. The fin structures 12 and 14 may have a line shaped pattern with a predetermined line pitch when viewed from the above and extend along a reference x axis.

According to the embodiment, each of the fin structures 12 is aligned with each of the fin structures 14. According to the embodiment, each of fin structures 12 has an end portion 12a with a sidewall surface 12b, and each of the fin structures 14 has an end portion 14a with a sidewall surface 14b that directly faces the sidewall surface 12b.

Shallow trench isolation (STI) regions 110 are formed into a horizontal major surface 10a of the semiconductor substrate 10 to electrically isolate the fin structures 12 and 14 from one another. According to the embodiment, a double diffusion break (DDB) isolation region 120 is provided in a fin cutting area between opposite edges (i.e. the end portions 12a and 14a) of the fin structures 12 and 14.

A plurality of word lines, for example, $WL_1$ and $WL_2$, are formed on the semiconductor substrate 10. The word lines, for example, $WL_1$ and $WL_2$, extend along a reference y axis and traverse the fin structures 12 and 14, respectively. A plurality of source lines, for example, $SL_1$ and $SL_2$, are formed on the semiconductor substrate 10 between the two word lines, for example, $WL_1$ and $WL_2$. The source lines, for example, $SL_1$ and $SL_2$, extend along the reference y axis and traverse the fin structures 12 and 14, respectively.

As can be best seen in FIG. 2, the DDB isolation region 120 has a top surface 120a. Each of the fin structures 12 and 14 protrudes from the top surface 120a of the DDB isolation region 120. According to the embodiment, the sidewall surface 12b is located above the top surface 120a. According to the embodiment, the sidewall surface 14b is located above the top surface 120a. According to the embodiment, the sidewall surfaces 12b and 14b are contiguous with the top surface 120a. According to the embodiment, the top surface 120a extends between the sidewall surface 12b and the sidewall surface 14b.

According to the embodiment, select gate transistors $SGT_1$, $SGT_2$ are formed on the fin structures 12 and 14, respectively. Each of the select gate transistors $SGT_1$ comprises a select gate 140 traversing the fin structures 12. That is, the select gate 140 at least covers two opposite vertical sidewalls of each fin structure 12. The select gate 140 may extend along a reference y axis and is formed integrally with one of the word lines, for example, $WL_1$.

According to the embodiment, a select gate dielectric layer 150 may be formed between the select gate 140 and each fin structure 12. According to the embodiment, the select gate dielectric layer 150 may comprise a core oxide layer and a high-k dielectric layer. According to the embodiment, a sidewall spacer 160 may be formed on each sidewall of the select gate 140.

Likewise, each of the select gate transistors $SGT_2$ comprises a select gate 240 traversing the fin structures 14. That is, the select gate 240 at least covers two opposite vertical sidewalls of each fin structure 14. The select gate 240 may extend along a reference y axis and is formed integrally with another one of the word lines, for example, $WL_2$. According to the embodiment, the select gates 140, 240 comprise metal gates.

According to the embodiment, a select gate dielectric layer 250 may be formed between the select gate 240 and each fin structure 14. According to the embodiment, the select gate dielectric layer 250 may comprise a core oxide layer and a high-k dielectric layer. According to the embodiment, a sidewall spacer 260 may be formed on each sidewall of the select gate 240.

According to the embodiment, a drain region 180 may be formed in the fin structure 12 on one side of the select gate 140, and a source region 190 may be formed in the fin structure 12 on the other side of the select gate 140. According to the embodiment, a drain region 280 may be formed in the fin structure 14 on one side of the select gate 240, and a source region 290 may be formed in the fin structure 14 on the other side of the select gate 240.

According to the embodiment, the semiconductor substrate 10 may have a first conductivity type, and the drain regions 180, 280 and the source regions 190, 290 may have a second conductivity type. For example, the first conductivity type is P type and the second conductivity type is N type, but is not limited thereto. It is understood that suitable ion wells (not shown) may be formed in the fin structures 12, 14 and in the semiconductor substrate 10 in some embodiments.

According to the embodiment, an epitaxial layer may be formed in the drain regions 180, 280 and the source regions 190, 290. According to the embodiment, the epitaxial layer may comprise SiP (for NMOS) or SiGe (for PMOS), but is not limited thereto.

According to the embodiment, vertical (or vertical-channel) program gate transistors $PGT_1$, $PGT_2$ are serially connected to the select gate transistors $SGT_1$, $SGT_2$ through the commonly shared source regions 190, 290, respectively. According to the embodiment, an edge of the source region 190 is spaced apart from the sidewall surface 12b of the end portion 12a. According to the embodiment, an edge of the source region 290 is spaced apart from the sidewall surface 14b of the end portion 14a.

According to the embodiment, no epitaxial material is formed on the sidewall surfaces 12b, 14b of the end portions 12a, 14a. During write operation of the antifuse OTP memory device 1, a vertical channel may be formed in the sidewall surfaces 12b, 14b.

According to the embodiment, the vertical program gate transistor $PGT_1$ comprises a program gate 340 that is electrically coupled to a source line, for example, $SL_1$. According to the embodiment, the vertical program gate transistor $PGT_2$ comprises a program gate 440 that is electrically coupled to another source line, for example, $SL_2$. According to the embodiment, the program gates 340, 440 comprise metal gates.

According to the embodiment, at least a portion of the program gate 340 is directly disposed above the DDB isolation region 120. The program gate 340 covers the sidewall surface 12b of the end portion 12a. According to the embodiment, a program gate dielectric layer 350 may be disposed between the program gate 340 and the sidewall surface 12b. Digit data, 0 or 1, may be written by the breakdown of the program gate dielectric layer 350.

According to the embodiment, at least a portion of the program gate 440 is directly disposed above the DDB isolation region 120. The program gate 440 covers the sidewall surface 14b of the end portion 14a. According to the embodiment, a program gate dielectric layer 450 may be disposed between the program gate 440 and the sidewall surface 14b. Digit data, 0 or 1, may be written by the breakdown of the program gate dielectric layer 450.

According to the embodiment, at least an interlayer dielectric (ILD) layer 500 may be deposited on the semiconductor substrate 10. The ILD layer 500 covers the antifuse OTP memory device 1 including the memory cell $M_1$ and memory cell $M_2$. Bitline contacts 510, 520 are formed in the ILD layer 500 to electrically connected the drain regions 180, 280 to bitlines $BL_1$, $BL_2$, respectively. According to the embodiment, no contact is formed to electrically connect the source regions 190, 290. During operation, the source regions 190, 290 are electrically floating.

Figure 3:
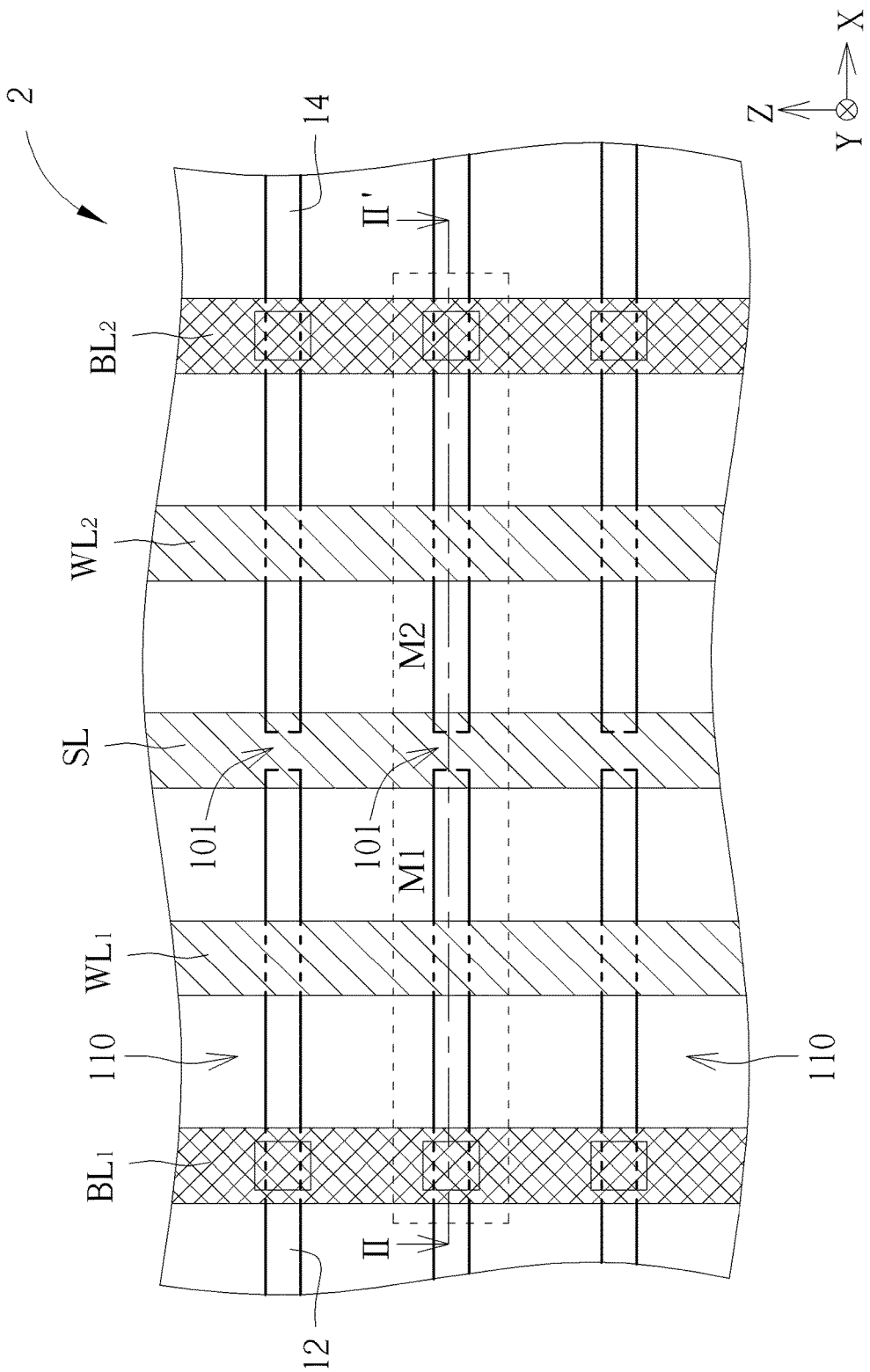
FIG. 3 is a schematic layout diagram showing a portion of an antifuse OTP memory device according to another embodiment of the invention.
Figure 4:
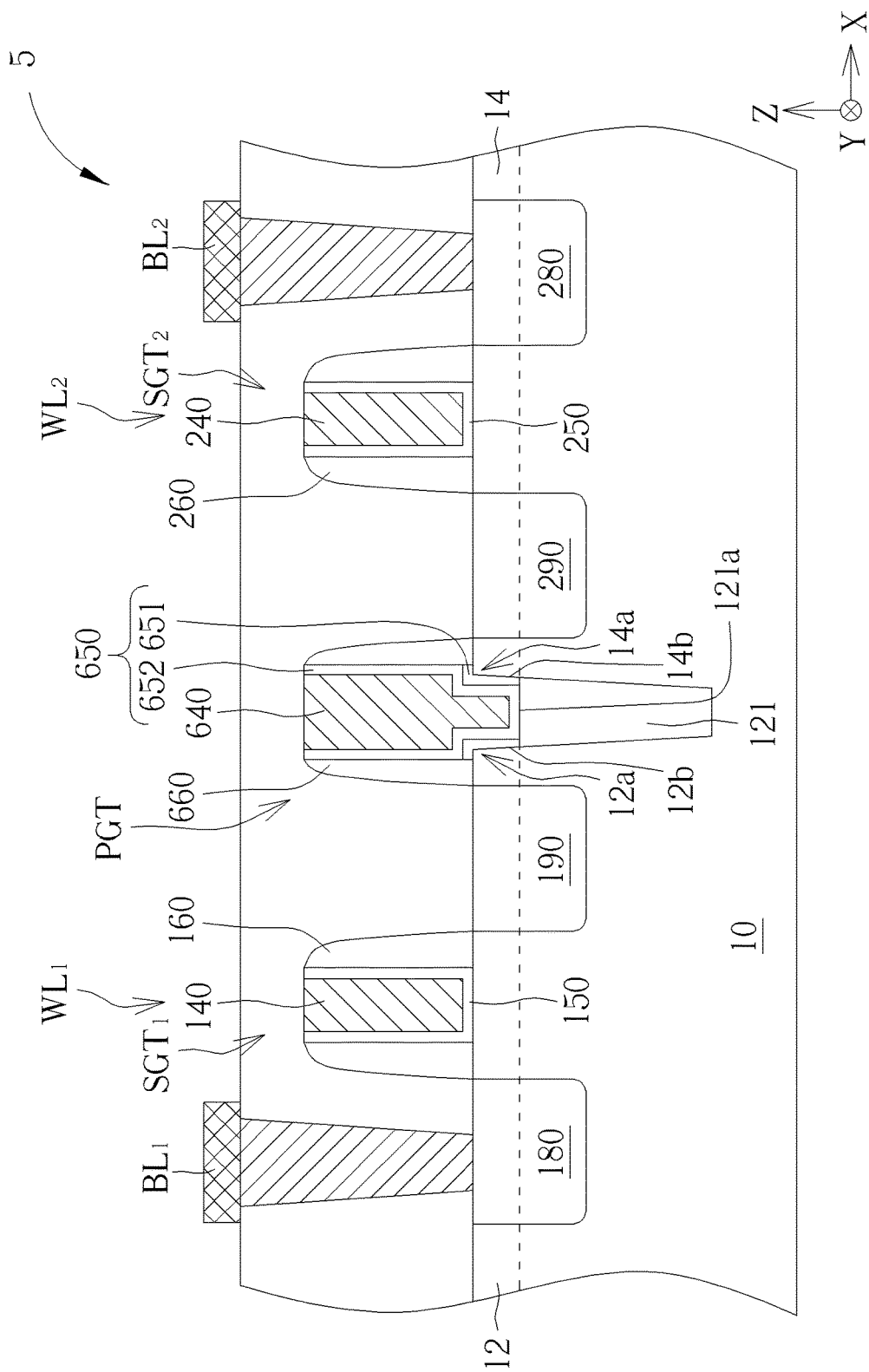
FIG. 4 is a schematic, cross-sectional view showing two antifuse OTP memory cells taken along line II-II' in FIG. 3.

Please refer to FIG. 3 and FIG. 4. FIG. 3 is a schematic layout diagram showing a portion of an antifuse OTP memory device according to another embodiment of the invention. FIG. 4 is a schematic, cross-sectional view showing two antifuse OTP memory cells of the antifuse OTP memory device taken along line II-II' in FIG. 3. Like numeral numbers designate like layers, regions, or elements.

As shown in FIG. 3 and FIG. 4, an antifuse OTP memory device 2 comprises an array of antifuse OTP memory cells including 1.5T (one and a half transistor) memory cell $M_1$ and 1.5T memory cell $M_2$, which are fabricated on a semiconductor substrate 10. For example, the semiconductor substrate 10 may be a silicon substrate, a silicon-on-insulator (SOI) substrate, or the like.

A plurality of fin structures 12 and 14 formed integrally with the bulk portion of the semiconductor substrate 10 is provided. The fin structures 12 and 14 may have a line shaped pattern with a predetermined line pitch when viewed from the above and extend along a reference x axis.

According to the embodiment, each of the fin structures 12 is aligned with each of the fin structures 14. According to the embodiment, each of fin structures 12 has an end portion 12a with a sidewall surface 12b, and each of the fin structures 14 has an end portion 14a with a sidewall surface 14b that directly faces the sidewall surface 12b. A gap 101 is provided between the end portion 12a and the end portion 14a.

Shallow trench isolation (STI) regions 110 are formed into a horizontal major surface 10a of the semiconductor substrate 10 to electrically isolate the fin structures 12 and 14 from one another. According to the embodiment, a single diffusion break (SDB) isolation region 121 is provided in a fin cutting area between opposite edges (i.e. the end portions 12a and 14a) of the fin structures 12 and 14.

A plurality of word lines, for example, $WL_1$ and $WL_2$, are formed on the semiconductor substrate 10. The word lines, for example, $WL_1$ and $WL_2$, extend along a reference y axis and traverse the fin structures 12 and 14, respectively. A plurality of source lines, for example, $SL_1$ and $SL_2$, are formed on the semiconductor substrate 10 between the two word lines $WL_1$, $WL_2$. The source lines $SL_1$, $SL_2$, extend along the reference y axis and traverse the fin structures 12, 14, respectively.

As can be best seen in FIG. 4, the SDB isolation region 121 has a top surface 121a. Each of the fin structures 12 and 14 protrudes from the top surface 121a of the SDB isolation region 121. According to the embodiment, the sidewall surface 12b is located above the top surface 121a. According to the embodiment, the sidewall surface 14b is located above the top surface 121a. According to the embodiment, the sidewall surfaces 12b and 14b are contiguous with the top surface 121a. According to the embodiment, the top surface 121a extends between the sidewall surface 12b and the sidewall surface 14b.

According to the embodiment, select gate transistors $SGT_1$, $SGT_2$ are formed on the fin structures 12 and 14, respectively. Each of the select gate transistors $SGT_1$ comprises a select gate 140 traversing the fin structures 12. That is, the select gate 140 at least covers two opposite vertical sidewalls of each fin structure 12. The select gate 140 may extend along a reference y axis and is formed integrally with one of the word lines, for example, $WL_1$.

According to the embodiment, a select gate dielectric layer 150 may be formed between the select gate 140 and each fin structure 12. According to the embodiment, the select gate dielectric layer 150 may comprise a core oxide layer and a high-k dielectric layer. According to the embodiment, a sidewall spacer 160 may be formed on each sidewall of the select gate 140.

Likewise, each of the select gate transistors $SGT_2$ comprises a select gate 240 traversing the fin structures 14. That is, the select gate 240 at least covers two opposite vertical sidewalls of each fin structure 14. The select gate 240 may extend along a reference y axis and is formed integrally with another one of the word lines, for example, $WL_2$. According to the embodiment, the select gates 140, 240 comprise metal gates such as tungsten, barrier metals, or work function metals, but is not limited thereto.

According to the embodiment, a select gate dielectric layer 250 may be formed between the select gate 240 and each fin structure 14. According to the embodiment, the select gate dielectric layer 250 may comprise a core oxide layer and a high-k dielectric layer. According to the embodiment, a sidewall spacer 260 may be formed on each sidewall of the select gate 240.

According to the embodiment, a drain region 180 may be formed in the fin structure 12 on one side of the select gate 140, and a source region 190 may be formed in the fin structure 12 on the other side of the select gate 140. According to the embodiment, a drain region 280 may be formed in the fin structure 14 on one side of the select gate 240, and a source region 290 may be formed in the fin structure 14 on the other side of the select gate 240. According to the embodiment, the SDB isolation region 121 has a depth that is deeper than a bottom of the source regions 190, 290.

According to the embodiment, the semiconductor substrate 10 may have a first conductivity type, and the drain regions 180, 280 and the source regions 190, 290 may have a second conductivity type. For example, the first conductivity type is P type and the second conductivity type is N type, but is not limited thereto. It is understood that suitable ion wells (not shown) may be formed in the fin structures 12, 14 and in the semiconductor substrate 10 in some embodiments.

According to the embodiment, an epitaxial layer may be formed in the drain regions 180, 280 and the source regions 190, 290. According to the embodiment, the epitaxial layer may comprise SiP (for NMOS) or SiGe (for PMOS), but is not limited thereto.

According to the embodiment, a vertical (or vertical-channel) program gate transistor (PGT) is serially connected to the select gate transistor $SGT_1$ through the source region 190 and is serially connected to the select gate transistor $SGT_2$ through the source region 290. The vertical program gate transistor (PGT) comprises a program gate 640 that is directly disposed above the top surface 121*a* of the SDB isolation region 121. The program gate 640 is electrically coupled to a source line SL. The program gate 640 covers the sidewall surface 12*b* and the sidewall surface 14*b*. According to the embodiment, the gap 101 may be completely filled up at least with the program gate 640.

According to the embodiment, a program gate dielectric layer 650 may be disposed between the program gate 640 and the sidewall surfaces 12*b*, 14*b*. According to the embodiment, the program gate dielectric layer 650 may comprise a core oxide layer 651 and a high-k dielectric layer 652. Digit data, 0 or 1, may be written by the breakdown of the program gate dielectric layer 650.

According to the embodiment, at least an interlayer dielectric (ILD) layer 500 may be deposited on the semiconductor substrate 10. The ILD layer 500 covers the antifuse OTP memory device 2 including the memory cell $M_1$ and memory cell $M_2$. Bitline contacts 510, 520 are formed in the ILD layer 500 to electrically connected the drain regions 180, 280 to bitlines $BL_1$, $BL_2$, respectively. According to the embodiment, no contact is formed to electrically connect the source regions 190, 290. During operation, the source regions 190, 290 are electrically floating.

Figures 5, 6:
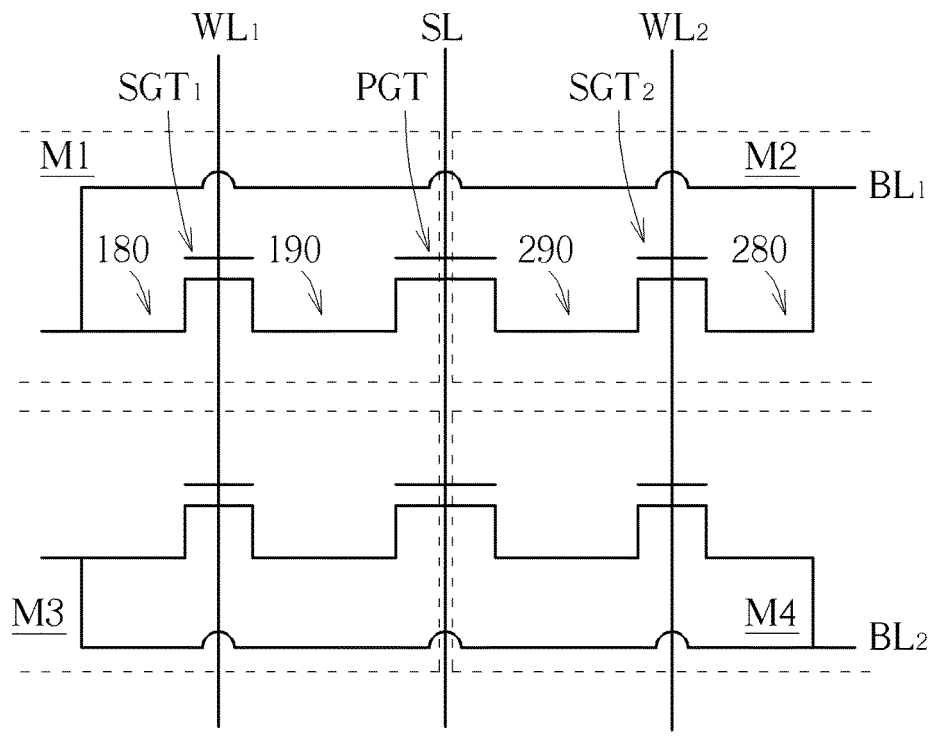
FIG. 5 and FIG. 6 illustrate the equivalent circuit and exemplary operation conditions for programming (PGM) and reading (READ) operations of the antifuse OTP memory cells as set forth in FIG. 4.

Please refer to FIG. 5 and FIG. 6. FIG. 5 and FIG. 6 illustrate the equivalent circuit and exemplary operation conditions for programming (PGM) and reading (READ) operations of the antifuse OTP memory cells as set forth in FIG. 4. For the sake of simplicity, only four memory cells $M_1$-$M_4$ are illustrated in FIG. 5, wherein the structure of the memory cells $M_1$ and $M_2$ are described in FIG. 3 and FIG. 4. The memory cell $M_3$ have the same structure as that of the memory cell $M_1$, and the memory cell $M_4$ have the same structure as that of the memory cell $M_2$.

As shown in FIG. 5 and FIG. 6, during program (PGM) or write operation, the selected word line (for example, $WL_1$ and $M_1$ are selected) is provided with a voltage source VCC. For example, VCC may range between 0.4V and 1.2V. The selected source line (SL) is provided with a high voltage HV. For example, HV may range between 3V and 10V. The selected bitline (for example, $BL_1$) may be grounded (0V). The unselected word line (for example, $WL_2$) is grounded (0V). The unselected source lines (i.e. other source lines in the memory array) are grounded. The unselected bitline (for example, $BL_2$) is floating (F).

During read (Read) operation, the selected word line (for example, $WL_1$ and $M_1$ are selected) is provided with a voltage source VCC. For example, VCC may range between 0.4V and 1.2V. The selected source line (SL) is grounded. The selected bitline (for example, $BL_1$) may be provided with a voltage source VCC. The unselected word line (for example, $WL_2$) is grounded. The unselected source lines (i.e. other source lines in the memory array) are grounded. The unselected bitline (for example, $BL_2$) is grounded.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An antifuse one-time programmable (OTP) memory cell, comprising:

a semiconductor substrate;

an isolation region in the semiconductor substrate, the isolation region having a top surface;

at least a fin structure protruding from the top surface of the isolation region, wherein the fin structure has an end portion with a sidewall surface above the top surface;

a select gate transistor on the fin structure, wherein the select gate transistor comprises a select gate traversing the fin structure, a select gate dielectric layer between the select gate and the fin structure, a drain region in the fin structure on one side of the select gate, and a source region in the fin structure on the other side of the select gate; and a vertical program gate transistor serially connected to the select gate transistor through the source region, wherein the vertical program gate transistor comprises a program gate directly disposed on the isolation region and covering the sidewall surface of the end portion, and a program gate dielectric layer between the program gate and the sidewall surface.

2. The antifuse OTP memory cell according to claim 1, wherein the semiconductor substrate has a first conductivity type, and the drain region and the source region have a second conductivity type.

3. The antifuse OTP memory cell according to claim 2, wherein the first conductivity type is P type and the second conductivity type is N type.

4. The antifuse OTP memory cell according to claim 1 further comprising an epitaxial layer in the drain region and the source region.

5. The antifuse OTP memory cell according to claim 4, wherein the epitaxial layer comprises SiP or SiGe.

6. The antifuse OTP memory cell according to claim 1, wherein an edge of the source region is spaced apart from the sidewall surface of the end portion.

7. The antifuse OTP memory cell according to claim 6, wherein no epitaxial material is formed on the sidewall surface of the end portion.

8. The antifuse OTP memory cell according to claim 1, wherein the select gate and the program gate are both a metal gate.

9. The antifuse OTP memory cell according to claim 1, wherein the select gate dielectric layer comprises a first core oxide layer and a first high-k dielectric layer.

10. The antifuse OTP memory cell according to claim 9, wherein the program gate dielectric layer comprises a second core oxide layer and a second high-k dielectric layer.

11. The antifuse OTP memory cell according to claim 1, wherein the source region is electrically floating.

12. An antifuse one-time programmable (OTP) memory device, comprising:

a semiconductor substrate;

a first fin structure having a first end portion with a first sidewall surface;

a second fin structure having a second end portion with a second sidewall surface directly facing the first sidewall surface;

an isolation region in the semiconductor substrate, the isolation region having a top surface extending between the first sidewall surface and the second sidewall surface;

a first select gate transistor on the first fin structure, wherein the first select gate transistor comprises a first select gate traversing the first fin structure, a first drain region in the first fin structure on one side of the first select gate, and a first source region in the first fin structure on the other side of the first select gate;

a second select gate transistor on the second fin structure, wherein the second select gate transistor comprises a second select gate traversing the second fin structure, a second drain region in the second fin structure on one side of the second select gate, and a second source region in the second fin structure on the other side of the second select gate; and a vertical program gate transistor serially connected to the first select gate transistor through the first source region and serially connected to the second select gate transistor through the second source region, wherein the vertical program gate transistor comprises a program gate directly disposed on the top surface of the isolation region and covering the first sidewall surface and the second sidewall surface.

13. The antifuse OTP memory device according to claim 12 further comprising a gap between the first end portion and the second end portion.

14. The antifuse OTP memory device according to claim 13, wherein the gap is completely filled up with the program gate.

15. The antifuse OTP memory device according to claim 12, wherein the vertical program gate transistor further comprises a program gate dielectric layer between the program gate and the first sidewall surface and between the program gate and the second sidewall surface.

16. The antifuse OTP memory device according to claim 12, wherein the first select gate transistor further comprises a first select gate dielectric layer between the first select gate and the first fin structure.

17. The antifuse OTP memory device according to claim 16, wherein the second select gate transistor further comprises a second select gate dielectric layer between the second select gate and the second fin structure.

18. The antifuse OTP memory device according to claim 12, wherein the first source region and the second source region are electrically floating.

19. The antifuse OTP memory device according to claim 12, wherein the isolation region has a depth that is deeper than a bottom of the first source region or a bottom of the second source region.

20. The antifuse OTP memory device according to claim 12, wherein the first select gate, the second select gate, and the program gate are metal gates.

* * * * *